(12) United States Patent
Bessho et al.

(10) Patent No.: US 7,142,474 B2
(45) Date of Patent: Nov. 28, 2006

(54) MAGNETIC MEMORY DEVICE AND RECORDING CONTROL METHOD FOR MAGNETIC MEMORY DEVICE

(75) Inventors: Kazuhiro Bessho, Tokyo (JP); Hiroshi Kano, Tokyo (JP)

(73) Assignee: Sony Corporation, Tokyo (JP)

( * ) Notice: Subject to any disclaimer, the term of this patent is extended or adjusted under 35 U.S.C. 154(b) by 148 days.

(21) Appl. No.: 10/488,933

(22) PCT Filed: Sep. 18, 2002

(86) PCT No.: PCT/JP02/09579

§ 371 (c)(1),
(2), (4) Date: Apr. 21, 2004

(87) PCT Pub. No.: WO03/025943

PCT Pub. Date: Mar. 27, 2003

(65) Prior Publication Data
US 2004/0233755 A1    Nov. 25, 2004

(30) Foreign Application Priority Data
Sep. 18, 2001    (JP)    .............................. 2001-283153

(51) Int. Cl.
*G11C 7/00* (2006.01)

(52) U.S. Cl. ...................... 365/221; 365/171; 365/173; 365/158

(58) Field of Classification Search ................ 365/221, 365/173, 158, 171
See application file for complete search history.

(56) References Cited

U.S. PATENT DOCUMENTS

| | | | |
|---|---|---|---|
| 6,169,689 B1* | 1/2001 | Naji | 365/173 |
| 6,522,578 B1* | 2/2003 | Poechmueller | 365/171 |
| 6,522,579 B1* | 2/2003 | Hoenigschmid | 365/173 |
| 6,621,731 B1* | 9/2003 | Bessho et al. | 365/171 |
| 6,667,899 B1* | 12/2003 | Subramanian et al. | 365/158 |
| 6,750,491 B1* | 6/2004 | Sharma et al. | 257/295 |
| 2004/0027854 A1* | 2/2004 | Iwata et al. | 365/158 |

FOREIGN PATENT DOCUMENTS

| | | |
|---|---|---|
| JP | 2001-156358 | 6/2001 |
| JP | 2002-197851 | 7/2002 |

* cited by examiner

*Primary Examiner*—Anh Phung
*Assistant Examiner*—Eric J. Wendler
(74) *Attorney, Agent, or Firm*—Oblon, Spivak, McClelland, Maier & Neustadt, P.C.

(57) ABSTRACT

A magnetic memory device includes magnetoresistance-effect storage elements arranged so as to store information by using a change in a magnetization direction of a storage area of each of the storage elements, and a control unit. The control unit controls a polarity of a first wiring current for generating a recording auxiliary magnetic field in a direction of a hard magnetization axis of the storage area, and a polarity of a second wiring current for generating a recording magnetic field in a direction of an easy magnetization axis of the storage area. Each of the first and second wiring currents has a first polarity when generating a "1" and a second polarity, different from the first polarity, when generating a "0".

9 Claims, 12 Drawing Sheets

MAGNETIC MEMORY DEVICE AND RECORDING CONTROL METHOD FOR MAGNETIC MEMORY DEVICE

TECHNICAL FIELD

The present invention relates to a technology for improving the reliability of connection wiring for magnetoresistance-effect storage elements in a magnetic memory device used as a memory device for storing information.

BACKGROUND ART

Information communication equipment, such as, in particular, personal compact information equipment typified by mobile communication terminal devices, such as portable terminals, is becoming increasingly common, and in such circumstances, further higher performance, such as higher integration, higher speed, and lower power consumption, is required for memory elements, logic carriers, and the like constituting the information communication equipment. For example, increases in density and capacity of nonvolatile memories are important as complementary technologies for magnetic recording devices including movable parts, such as magnetic hard disc drives. In other words, since it is difficult to reduce the size, increase the speed, and reduce the power consumption in devices including movable parts, the role of nonvolatile memories is becoming increasingly important in fields where carryability and portability are regarded as being important.

Semiconductor flash memories, ferroelectric nonvolatile memories (FeRAMs), and the like are commercially used as nonvolatile memories, and research and development is being carried out in order to improve the performance even more. Recently, MRAMs (magnetic random access memories) utilizing the tunnel magnetoresistance (TMR) effect have been the focus of attention as nonvolatile memories using a magnetic material (see, for example, "Naji et al. ISSCC2001").

The principle of operation of an MRAM will now be briefly explained. This memory device includes many minute storage carriers (magnetic storage carriers) made of magnetic materials. The MRAM has a structure in which wiring for regularly arranging such storage carriers and for allowing access to the respective storage carriers is provided, so that magnetic information recording can be performed.

For example, in an arrangement in which two pairs of parallel conducting wires cross each other to form a lattice structure and in which magnetic storage carriers (memory cells) are disposed in positions corresponding to respective lattice points of the parallel conducting wires, information writing is performed by controlling the magnetization of the magnetic materials by using a magnetic field (combined current magnetic field) generated by allowing predetermined current to flow in a conducting wire (word line) arranged at one end of each of the magnetic storage carriers and in a conducting wire (bit line) for reading arranged at the other end of each of the magnetic storage carriers. Generally, depending on the direction of magnetization of the magnetic materials, information of a logical value of "0" and information of a logical value of "1" are differentiated from each other and stored. Also, for information reading, a cell is selected by using an element such as a transistor, and the direction of magnetization of a magnetic material constituting the cell can be extracted as a voltage signal in accordance with the galvanomagnetic effect. Each of the cells has a basic film structure, for example, such as a three-layer structure (a ferromagnetic tunnel junction, that is, a magnetic tunnel junction="MTJ") including a ferromagnetic material, an insulating material, and a ferromagnetic material. Using one ferromagnetic layer as a fixed reference layer and using the other ferromagnetic layer as a storage layer causes the direction of magnetization of the storage layer to correspond to a voltage signal in accordance with the TMR effect.

It is obvious that write operation also needs selection of a desired cell to store information. A method for selecting a cell will now be described.

In general, it is known that, when a magnetic field in the direction opposite to magnetization is applied in the direction of the easy magnetization axis of a ferromagnetic material, the magnetization is reversed to the direction of the applied magnetic field at a critical value±Hsw (this is called a "reversal magnetic field"). The value of the reversal magnetic field can be theoretically calculated from the minimum energy condition. It is also known that, in a case where the magnetic field is applied not only in the direction of the easy magnetization axis but also in the direction of the hard magnetization axis, the absolute value of the reversal magnetic field is reduced. The value of the reversal magnetic field in this case can also be calculated from the minimum energy condition. When the magnetic field applied in the direction of the hard magnetization axis is represented by "Hx" and the reversal magnetic field at that time is represented by "Hy", the relationship between the applied magnetic field and the reversal magnetic field is represented as follows:

$$Hx^{2/3}+Hy^{2/3}=Hc^{2/3}.$$

A curved line (for example, see FIGS. 4 and 7) represented by the above mathematical expression on the Hx-Hy plane having two orthogonal axes, Hx and Hy, is called an asteroid curve. Using the asteroid curve is convenient for explaining the method for selecting a cell. Here, "Hc" represents coercive force.

In MRAMs having a structure in which a magnetic field generated by a recording word line is approximately equal to the direction of the easy magnetization axis, the magnetization is reversed by the magnetic field generated by the word line to perform recording. Since a plurality of cells are regularly spaced from the recording word line, if current that generates a field larger than the reversal magnetic field flows in the recording word line, recording is also unintentionally performed in other cells (positionally equivalent cells). Thus, when current flows in a bit line corresponding to a cell desired to be selected (selected cell) to generate a magnetic field in the hard magnetization field, recording can be performed without affecting the other equivalent cells by utilizing a reduction in the reversal magnetic field of the selected cell. In other words, when the reversal magnetic field of the selected cell in a case where current flows in the bit line is represented by "Hc(h)" and the reversal magnetic field in a case where the magnetic field generated by the bit line is 0 (in other words, current does not flow) is represented by "Hc(0)", if the magnetic field "H" generated by the current of the recording word line is set so as to satisfy the relationship of "Hc(h)<H<Hc(0)", only a desired cell is selected to perform recording. (In other words, this is because that, although magnetization reversal occurs in the selected cell since the magnetic field H of the selected cell is larger than Hc(h), magnetization reversal does not occur in the equivalent cells since the magnetic field H of the equivalent cells is smaller than Hc(0).)

As described above, MRAMs arranged using a plurality of recording carriers including magnetic materials have advantages, for example, as described below. Thus, such MRAMs are regarded as being promising as future nonvolatile memories.

1) To be nonvolatile and be capable of nondestructive reading and random access;

2) To be rewritable a large number "N" of times ($N>10^{15}$);

3) To operate at high speed (processing speed<5 nanoseconds);

4) To be free from soft errors; and

5) To have excellent process uniformity because they are formed only by wiring processing after production of MOS elements.

In particular, MRAMs have better performance than flash memories in points 1 to 3 mentioned above. Also, MRAMs are superior to the above-mentioned FeRAMs in point 5. MRAMs are expected to be used as memories capable of satisfying both a higher level of integration, similar to the DRAM level, and a speed similar to the SRAM level. Such MRAMs have the potential to replace all system LSI consolidated memories.

Incidentally, the use of current for performing information writing may be an obstacle to an increase in the performance of MRAMs.

In general, wiring has an upper limit of an allowable current density, and a current exceeding the upper limit is likely to cause deterioration and breaking due to electromigration. In particular, in accordance with an increase in the level of integration and a reduction in the width of wiring, a critical current value that is allowable to flow in the writing line is reduced; thus reducing the size of a magnetic field generated by the current. Thus, although the coercive force (Hc) in a storage area of a storage carrier must be reduced, a technological difficulty occurs because, in general, the coercive force of a storage area tends to be increased in accordance with a reduction in the size of a cell. Reconsideration and investigation of fundamental items, for example, such as structural design of elements and selection of materials, are unavoidable.

Accordingly, an object of the present invention is to raise the upper limit of the current density of wiring, without significantly changing the material, structure, and the like, in order to deal with higher integration of storage elements constituting a magnetic memory device and miniaturization of wiring.

DISCLOSURE OF INVENTION

In order to achieve the above object, the present invention controls, with respect to wiring for generating a recording auxiliary magnetic field in the direction of the hard magnetization axis of a storage area of a magnetoresistance-effect storage element, current for generating the magnetic field so as not to be fixed in one direction.

According to the present invention, by controlling wiring current for generating a magnetic field in the direction of the hard magnetization axis of a storage area to flow bidirectionally (in other words, current is controlled not to always flow in the same direction but current is controlled to be a bidirectional current so as to flow in different directions), deterioration and breaking due to electromigration is less likely to occur. Thus, resistance to deterioration, breaking, and the like of recording wiring is improved, and the reliability can thus be increased.

BEST MODE FOR CARRYING OUT THE INVENTION

The present invention relates to a magnetic memory device and a recording control method for the magnetic memory device. The magnetic memory device includes magnetoresistance-effect storage elements and stores information by using a change in the magnetization direction of a storage area of each of the storage elements. The magnetoresistance-effect elements may be giant magnetoresistance (GMR) effect elements or tunnel magnetoresistance (TMR) effect elements. For example, magnetoresistance-effect elements are applicable to a storage device, such as the MRAM (magnetic random access memory) described above. Also, generally, the magnetic memory device includes unit elements (storage elements) including a ferromagnetic film. The number of unit elements is not limited, and may be many or a few.

Figure 1:
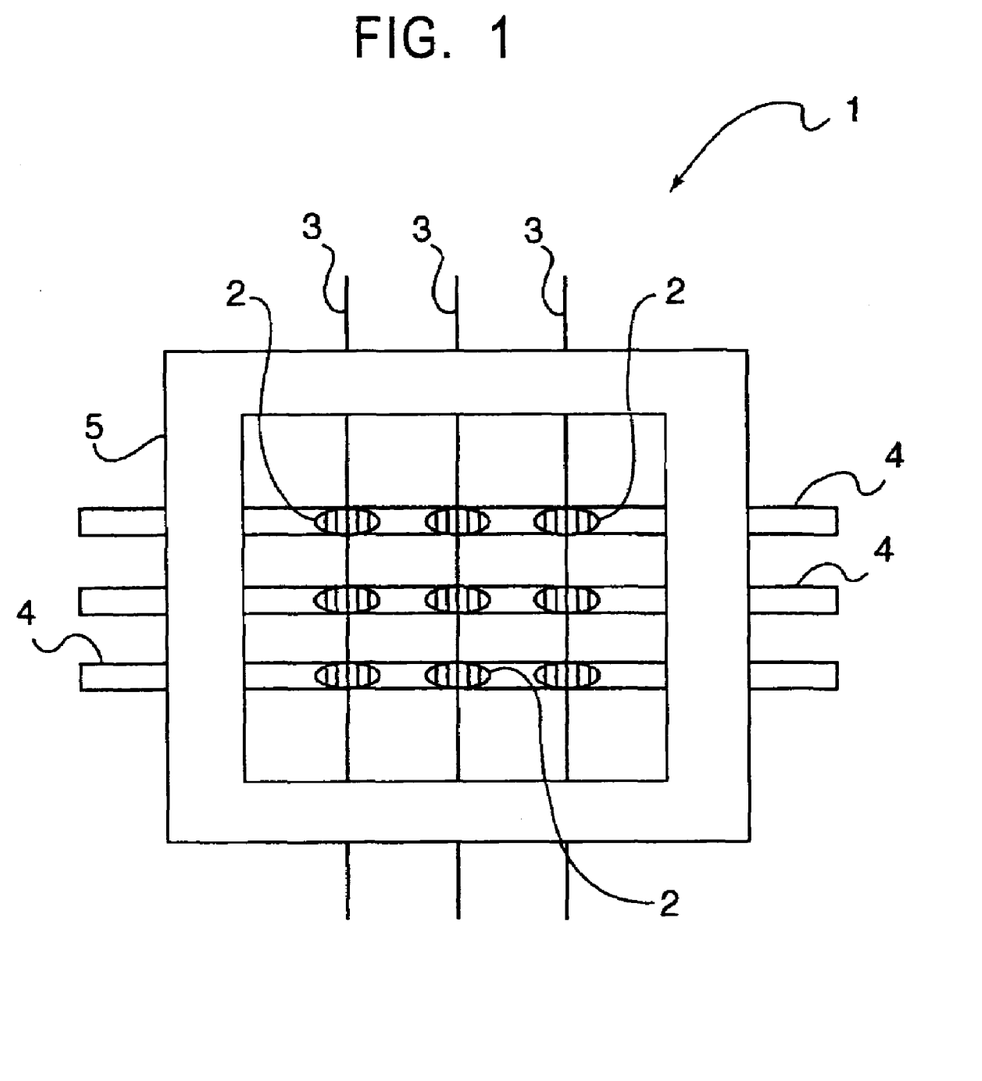
FIG. 1 is a schematic diagram showing an example of the basic structure of a magnetic memory device.
Figure 2:
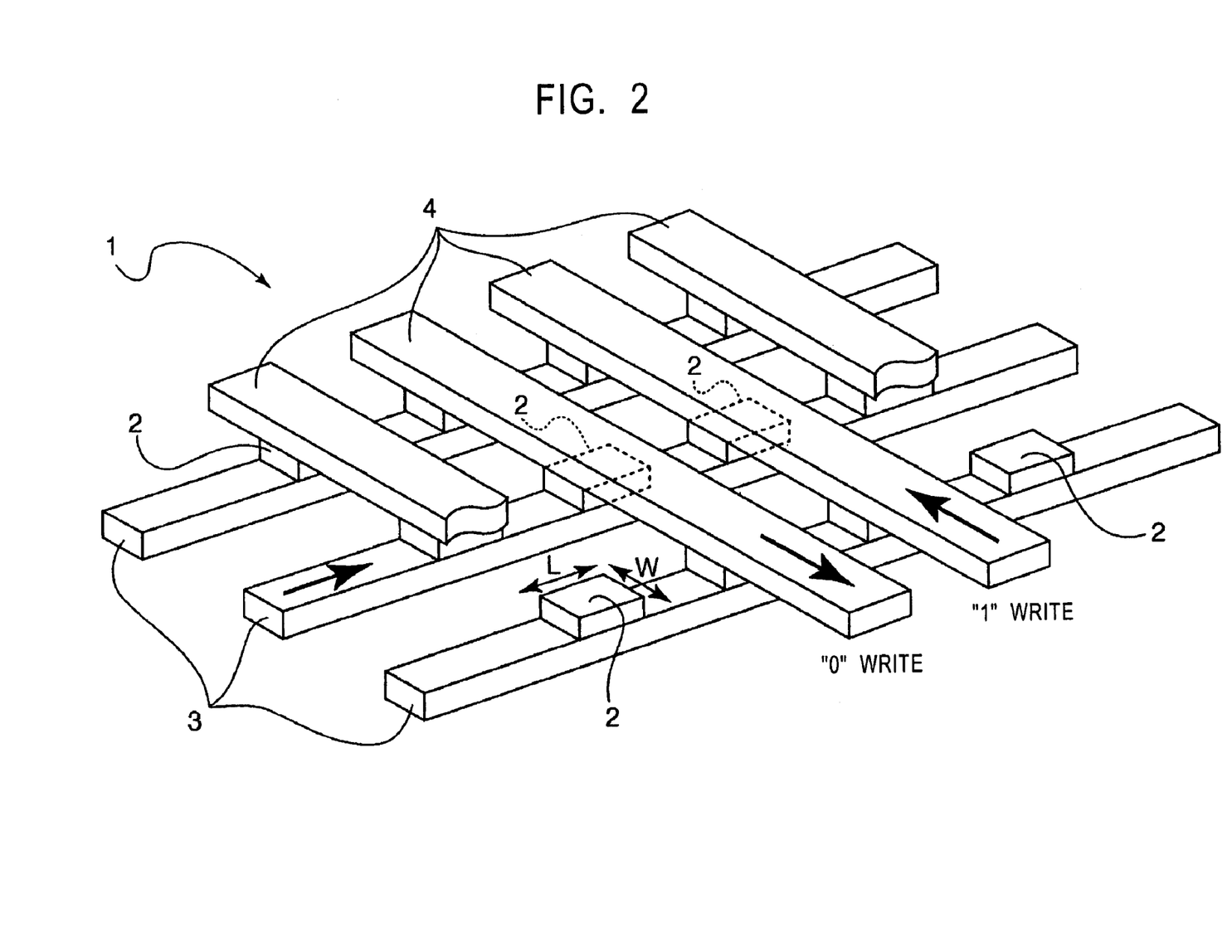
FIG. 2 is a schematic perspective view for explaining the example of the structure of the magnetic memory device.

FIGS. 1 and 2 show the basic structure of a magnetic memory device according to the present invention. FIG. 1 is a plan view schematically showing an example of the basic structure of an MRAM, and FIG. 2 is a perspective view schematically showing the arrangement of elements and wiring.

A magnetic memory device 1 includes a plurality of storage elements 2 arranged in a matrix. A magnetoresistance-effect element is used as each of the storage elements.

For wiring, in a lattice structure having two pairs of parallel wires arranged orthogonally to each other, storage elements are disposed in respective lattice points and memory cells each including one element are respectively provided. In other words, the wires arranged along the vertical direction of FIG. 1 represent word lines 3 (in the drawing, they are represented by thin lines for the sake of convenience), and the wires arranged along the horizontal direction of the drawing represent bit lines 4 (in the drawing, they are represented by thick lines for the sake of convenience; also, only three bit lines and three word lines are shown for the sake of simplification). Also, the intersecting wires cross the storage elements vertically and horizontally so that each of the storage elements can be identified by designating a bit line and a word line corresponding to its row position and column position, respectively.

As shown in FIG. 2, each of the storage elements 2 is sandwiched between a word line and a bit line from above and below and is arranged at the intersection of both lines. Here, "W" and "L" shown in the drawing represent the size of the storage elements. "W" represents the width in the direction parallel to the bit line, and "L" represents the length in the direction parallel to the word line.

A peripheral circuit 5 (see within the square frame of FIG. 1) for individually driving the storage elements 2 is arranged around the storage elements arranged in a matrix. The peripheral circuit 5 functions as a control circuit. This peripheral circuit may be, for example, a circuit (a switch circuit or a logic circuit for cell selection) for selectively applying current to the word line and the bit line.

For the MRAM, in addition to the arrangement described above, transistors (MOS FETs or the like) for reading information from the storage elements, diodes, word lines connected to the gate of the respective transistors, a ground layer necessary for formation of the storage element, and the like (explanation thereof is omitted) are provided.

Although a mode in which a GMR effect element is used as each of the storage elements, as described above, and a mode in which a TMR effect element is used as each of the storage elements are possible, the latter example will now be described below.

Figure 3:
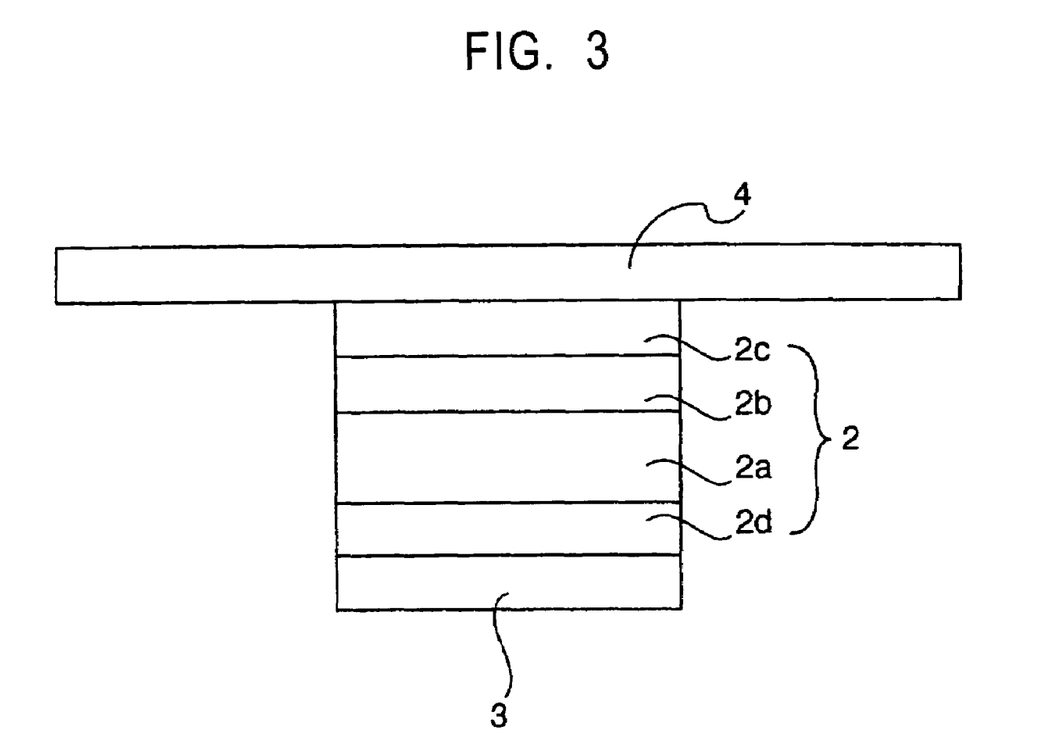
FIG. 3 shows a structural example for explaining the relationship between the cross-sectional structure and wiring of a single storage element.

FIG. 3 shows an example of the structure of one of the storage elements 2 sandwiched between the corresponding bit line 4 and the corresponding (recording) word line 3. The storage element 2 includes a three-layer structure called MTJ composed of a storage layer 2a, an insulating wall layer 2b, and a reference layer 2c.

In this example, the reference layer 2c is formed on one end (top end) of the storage element 2. This layer is connected to the bit line 4, and the insulating wall layer 2b and the storage layer 2a are formed in the direction moving away from the bit line in that order. An interlayer insulating film 2d is formed below the storage layer 2a. The storage layer 2a is connected to the word line 3 with the interlayer insulating film 2d therebetween.

The storage layer 2a corresponding to the storage area of the element is made of a ferromagnetic material (CoFe, NiFe, or the like). Since the magnetization direction of the storage layer 2a rotates relatively easily, the magnetization direction is changed by using a current magnetic field generated by current flowing in the word line and the bit line, so that writing (recording) of information can be performed. Thus, the storage layer 2a has uniaxial anisotropy originating from one or more of shape anisotropy, crystal anisotropy, induced anisotropy, and the like.

One of the word line and the bit line is arranged in the direction substantially parallel to the easy magnetization axis of the storage layer 2a, and the other one of the word line and the bit line is arranged in the direction substantially parallel to the hard magnetization axis of the storage layer 2a. For example, if the bit line 4 is substantially parallel to the easy magnetization axis, a magnetic field generated by the current flowing in the bit line becomes a magnetic field aligned along the direction of the hard magnetization axis, and a magnetic field generated by the current flowing in the word line 3 becomes a magnetic field aligned along the direction of the easy magnetization axis. An explanation will now be given on the assumption of such a mode, for the sake of convenience. (Needless to say, the present invention is also applicable to a mode in which the word line is substantially parallel to the easy magnetization axis.)

The insulating wall layer 2b is made of an insulating material (alumina or the like) and functions to break the magnetic connection between the storage layer 2a and the reference layer 2c and to allow a tunnel current to flow. Also, the reference layer 2c is formed by a ferromagnetic material (CoFe or the like), and its magnetization direction is fixed directly or indirectly by an antiferromagnetic material (for example, PtMn or the like).

A case where a GMR element is used has a multilayered structure basically similar to the case described above although there is a little difference (for example, a wall layer is not provided) in the structure (thus, a detailed explanation is omitted).

In the MRAM provided with the TMR storage elements having the structure described above, each of the elements is arranged in an area in which the word line intersects the bit line, and information writing is performed by selecting each of the storage elements by using the asteroid magnetization reversal characteristics described above.

Figure 4:
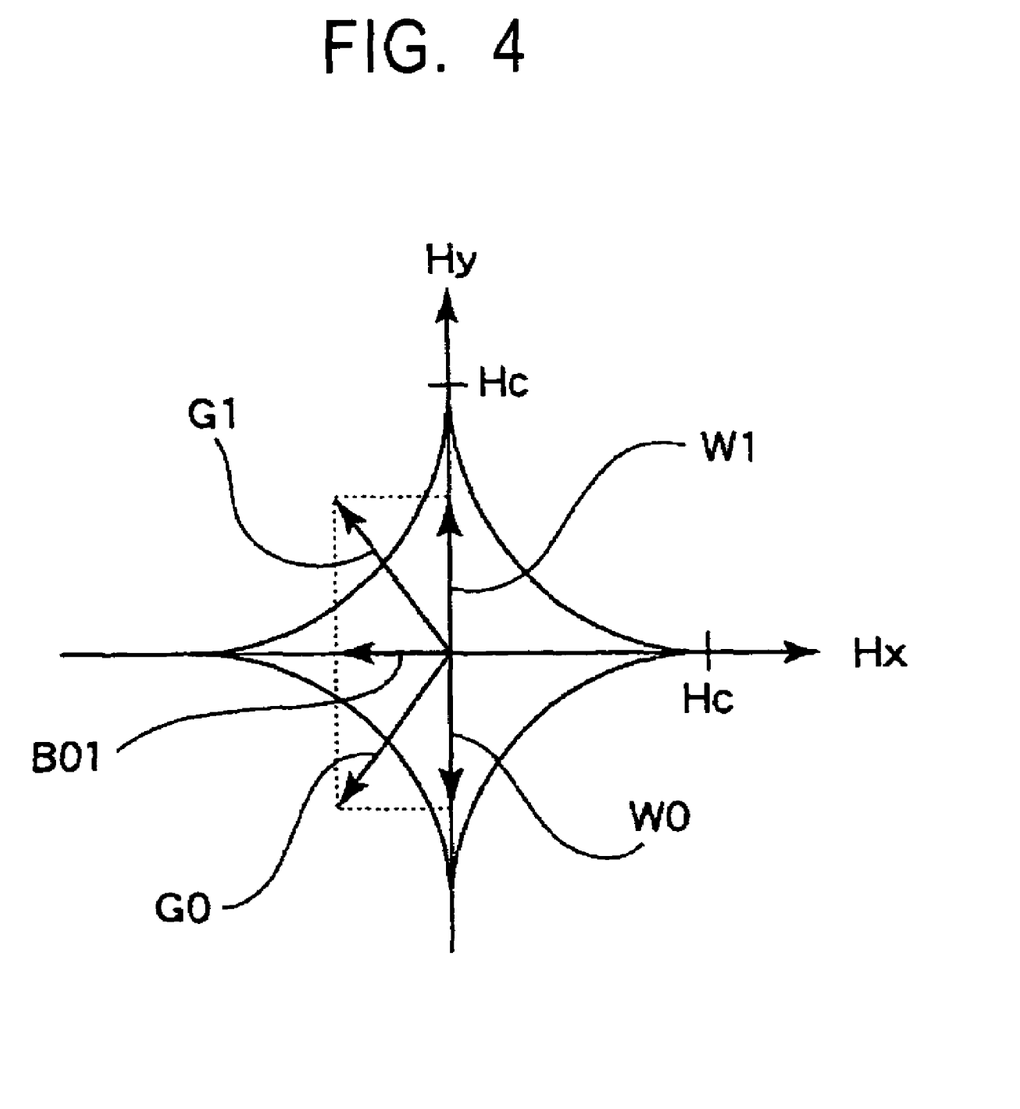
FIG. 4 shows an example of an asteroid curve.

FIG. 4 shows an example of an asteroid curve in which the horizontal axis represents Hx (magnetic field in the direction of the hard magnetization axis) and the vertical axis represents Hy (magnetic field in the direction of the easy magnetization axis). Here, in this case, as described above, since the bit line 4 is substantially parallel to the easy magnetization axis, Hx represents a magnetic field generated by the bit line and Hy represents a magnetic field generated by the recording word line.

Arrows shown in the drawing represent the following:

Arrow "W1"=magnetic field generated by word line when "1" is written;

Arrow "W0"=magnetic field generated by word line when "0" is written;

Arrow "B01"=magnetic field generated by bit line when "0" or "1" is written;

Arrow "G1"=combined magnetic field when "1" is written; and

Arrow "G0"=combined magnetic field when "0" is written.

The combined magnetic field represented by G1 is obtained by vector addition of the magnetic fields represented by W1 and B01. Similarly, the combined magnetic field represented by G0 is obtained by vector addition of the magnetic fields represented by W0 and B01 (G1 and G0 are linear symmetric with respect to the Hx axis). Also, "0" and "1" represent logical values or status values. A diamond (asteroid) area surrounded by the curved lines shown in quadrants of the Hx-Hy plane represents an unrecordable region.

In general, the direction of current flowing in the recording word line corresponds to the direction in which the magnetization of the storage area is desired to be reversed (in other words, the direction in which the magnetization is being reversed). Thus, from this meaning, the current flowing in the recording word line is called a "program current". In other words, since the direction of the current for rewriting to the logical value "1" is opposite to the direction of the current for rewriting to the logical value "0", the current flowing in the recording word line is made to flow in both directions in some cases.

In contrast, current flowing in the bit line is used only for reducing the reversal magnetic field of a selected cell so that information can be written only in the selected cell without affecting other equivalent cells, as described above, and this reduction effect of the reversal magnetic field is symmetric with respect to the direction (orientation) of the current. In other words, in this example, the use of only a characteristic part represented by the left half of the asteroid curve of FIG. 4 is sufficient for the purpose of selecting a cell (selecting a storage layer). (Alternatively, a mode in which only the right half of FIG. 4 is used and the left half is not used is possible, although this is substantially equal to the case described above.)

Figure 5:
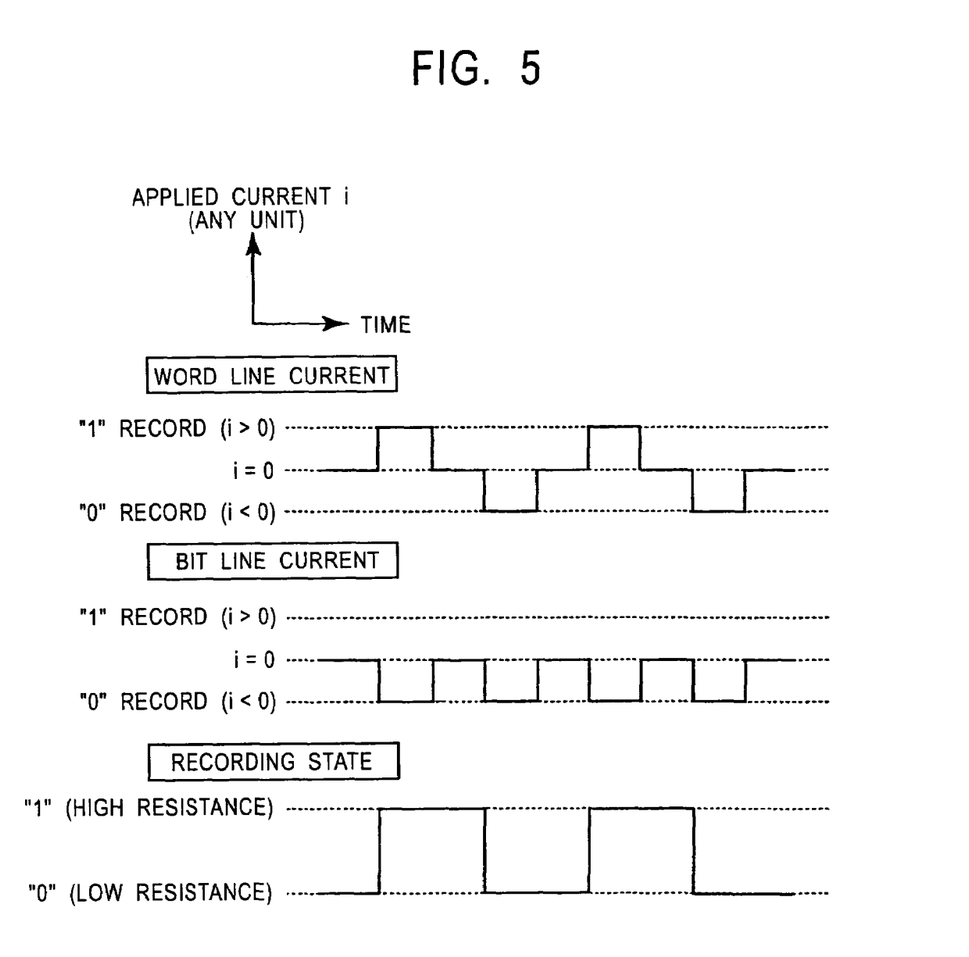
FIG. 5 is an illustration for explaining a known recording control method.

As described above, controlling the direction of the bit line current to be defined in one direction is a known recording method, and this method is shown in FIG. 5.

The waveform of a word line current, the waveform of a bit line current, and a recording state are indicated on the upper level, the intermediate level, and the lower level, respectively, in the drawing. For the current waveforms, as shown by the two arrows, the vertical direction of the drawing represents the direction of an applied current and the horizontal direction of the drawing represents the time-base direction. (Time lapses in the rightward direction.)

On the basis of "i=0", the direction of current (word line current) flowing in the word line when "1" is recorded corresponds to the positive direction (i>0) and the direction of current flowing in the word line when "0" is recorded corresponds to the negative direction (i<0). In this example, the direction changes alternately between positive and negative with the lapse of time. Accordingly, a word line magnetic field when "0" and "1" are alternately recorded is generated.

Also, the direction of current (bit line current) flowing in the bit line when "0" is recorded corresponds to the negative direction (i<0), and this direction is always kept to the same (negative direction). Accordingly, a bit line magnetic field when "0" and "1" are alternately recorded is generated.

For a recording state, "1" corresponds to a high resistance state, and "0" corresponds to a low resistance state. When the word line current is in the positive direction and the bit line current is in the negative direction, the "1" state is recorded, and when the word line current is in the negative direction and the bit line current is in the negative direction, the "0" state is recorded.

Accordingly, in this example, as is clear from the application timing and the waveform of the current, for the program current flowing in the word line, a pattern in which "1" and "0" are alternately recorded in the storage element is illustrated, and the direction of the current flowing in the bit line is defined in one direction (in this example, the negative direction). In other words, only the left half (the second quadrant and the third quadrant) of the Hx-Hy plane of the asteroid curve of FIG. 4 is used, and the right half (the first quadrant and the fourth quadrant) is not used.

Similarly, in a case where the direction of the bit line current is defined in the positive direction, only the right half (the first quadrant and the fourth quadrant) of the Hx-Hy plane of the asteroid curve of FIG. 4 is used and the left half (the second quadrant and the third quadrant) is not used.

In any case, if the polarity of the bit line current is controlled to be fixed in one direction, only one half of the asteroid curve is used. Thus, deterioration and breaking is likely to occur due to electromigration.

Accordingly, in the present invention, the direction of current flowing in wiring for generating a recording auxiliary magnetic field in the hard magnetization direction of a storage area of a storage device is controlled so as not to be fixed in one direction. In other words, in the example described above, the bit line current flows in the positive direction or in the negative direction depending on the time. Thus, the current flows bidirectionally.

Figure 6:
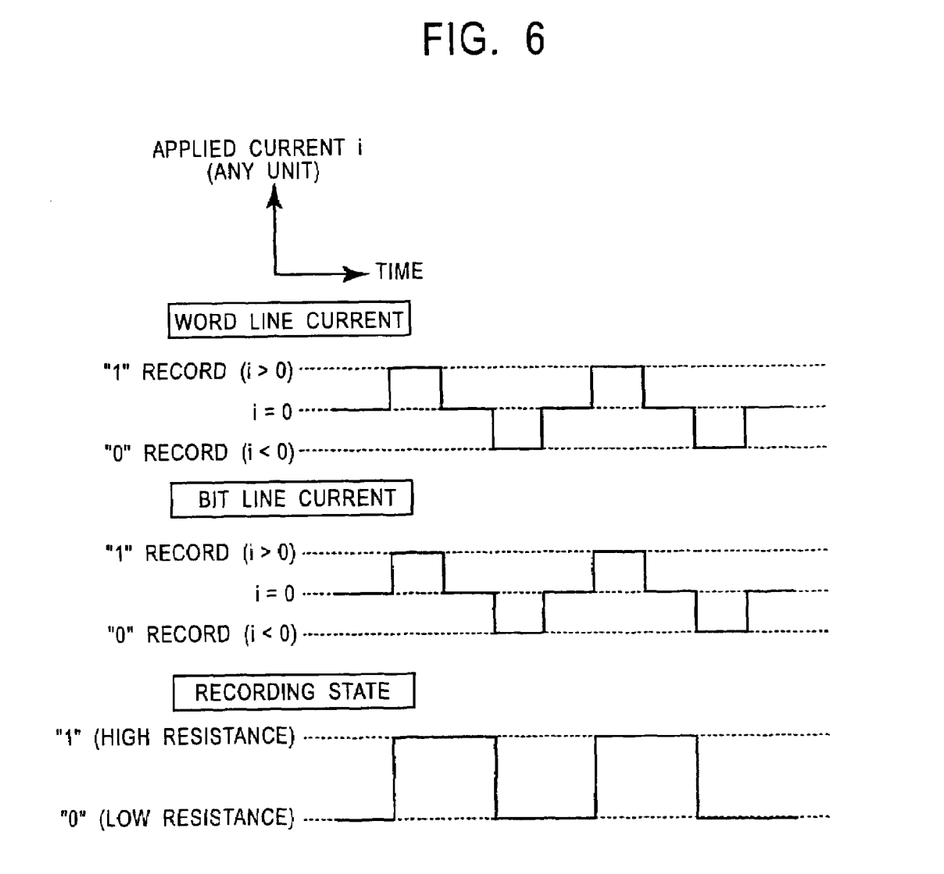
FIG. 6 is an illustration for explaining, together with FIG. 7, an example of a recording control method according to the present invention, and shows a waveform of each wiring current and a recording state.

FIG. 6 shows an example of a recording control method according to the present invention, and the timing of application of wiring current and a recording state are shown. The setting of the drawing, symbols, and the like are the same as in FIG. 5.

The setting of the direction of a word line current and the waveform of the current are the same as in FIG. 5.

On the basis of "i=0", the direction of a bit line current when "1" is recorded corresponds to the positive direction (i>0) and the direction of the bit line current when "0" is recorded corresponds to the negative direction (i<0). The direction changes alternately between positive and negative with the lapse of time. Accordingly, a bit line magnetic field when "0" and "1" are alternately recorded is generated.

For a recording state, when the word line current and the bit line current are in the positive direction, a "1" state (high resistance state) is recorded, and when the word line current and the bit line current are in the negative direction, a "0" state (low resistance state) is recorded.

As described above, an example in which the bit line current is controlled to flow in two directions and in which the direction of the current is alternately changed with the lapse of time, such as the current flowing in the positive direction (or the negative direction) at one point in time (recording time) and the current flowing in the negative direction (or the positive direction) at the next recording time, is shown. Accordingly, the direction (that is, the sign) of the bit line current is changed depending on whether "0" or "1" is being written in accordance with the program current.

Figure 7:
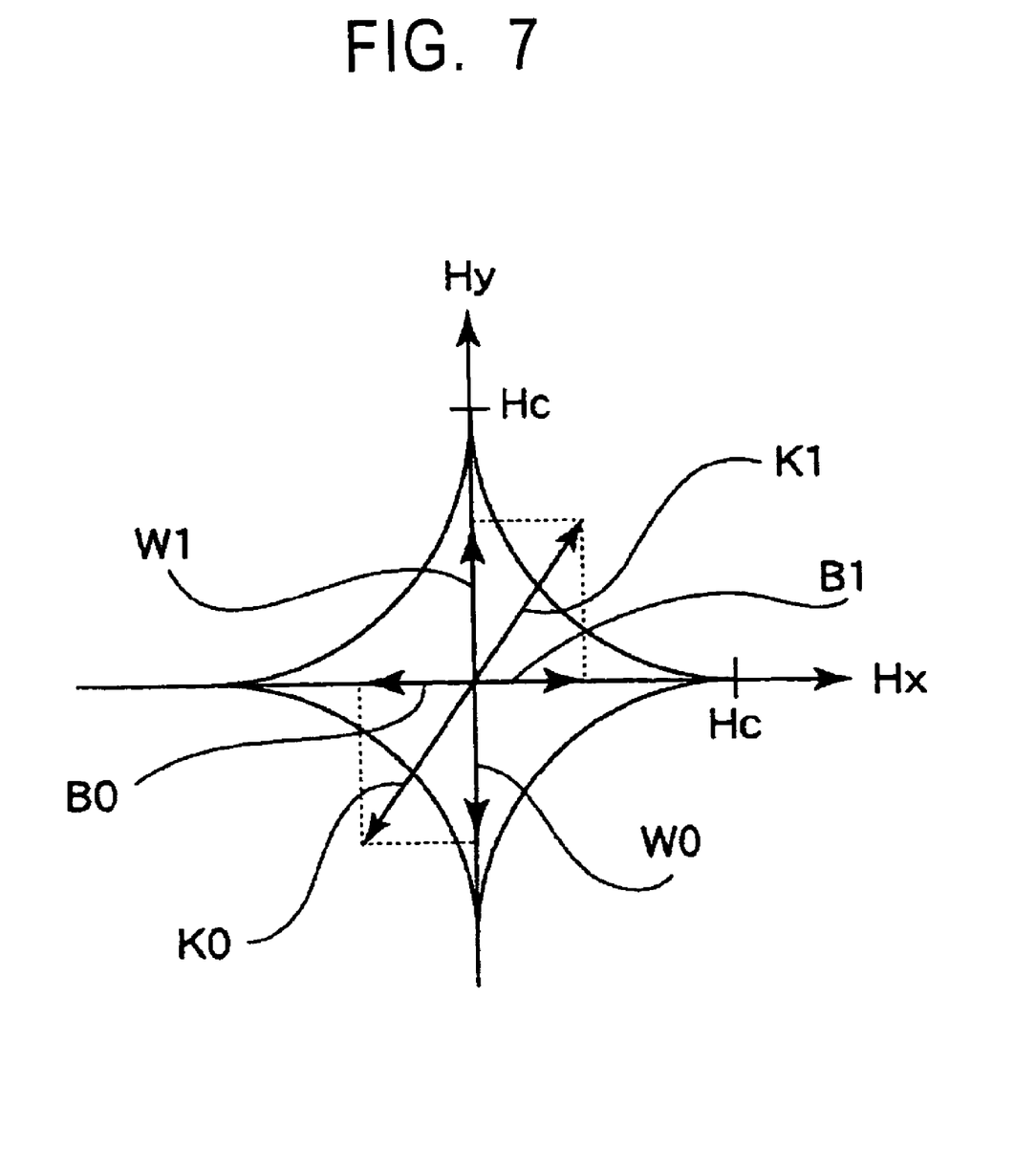
FIG. 7 is an illustration for explaining the principle by using an asteroid curve.

FIG. 7 is an illustration for explaining the method described above by using an asteroid curve. The setting of Hx and Hy is the same as in FIG. 4, and Hc, "0", "1", and the like are the same as described above.

Arrows "W1" and "W0" are as described above, but some magnetic field vectors represented by arrows are different from FIG. 4, as described below:

Arrow "B1"=magnetic field generated by bit line when "1" is written;

Arrow "B0"=magnetic field generated by bit line when "0" is written;

Arrow "K1"=combined magnetic field when "1" is written; and

Arrow "K0"=combined magnetic field when "0" is written.

As is clear from the drawing, the magnetic field generated by the bit line represented by B1 is in the positive direction (rightward direction of the drawing) of the Hx axis, and in contrast, the magnetic field generated by the bit line represented by B0 is in the negative direction (leftward direction of the drawing) of the Hx axis. Also, the combined magnetic field represented by K1 is obtained by vector addition of the magnetic fields represented by W1 and B1. Similarly, the combined magnetic field represented by K0 is obtained by vector addition of the magnetic fields represented by W0 and B0. In this example, the direction of K1 is opposite to the direction of K0.

Unlike the known method in which only part of the asteroid curve is used, such as only the right half or only the left half, the fact that both the right half and left half are used is a characterizing feature of the present invention.

In other words, by controlling the current flowing in the wiring (bit line) for generating the recording auxiliary magnetic field to flow not in one direction but in two directions, resistance to deterioration and breaking due to electromigration can be improved as compared with the known method. The reason for this will be explained. Electromigration is displacement of an atom of a material constituting a bit line due to a force received from a moving electron (current) in the moving direction. Current flowing in two directions causes displacement in the two directions. Thus, movement similar to vibration in the two directions is repeated at a position of a bit line near the point before current is applied to the bit line. Thus, a longer time is needed for generation of a large displacement resulting in breaking or the like, as compared with the case where a bit current flows in one direction, as in the known method. Consequently, resistance to deterioration and breaking is improved, and the reliability of the wiring can thus be increased. Also, by using the present invention, an increase in the density of an MRAM, which has been regarded as being difficult due to the tendency to increase the reversal magnetic field due to micromachining of wiring and miniaturization in the size of a storage element, can be realized.

The recording control described with reference to FIGS. 6 and 7 is an example of the present invention. The essential point of the present invention is to control current for generating a recording auxiliary magnetic field so as not to be fixed in one direction. Thus, the modes described below are possible.

In other words, control of the polarity of a bit line current is broadly classified into the modes (or methods) as follows:

(I) a mode in which the relationship between the polarity of wiring current for generating a recording auxiliary magnetic field in the direction of the hard magnetization axis of a storage area and the polarity of wiring current for generating a recording magnetic field in the direction of the easy magnetization axis of the storage area is controlled to be always equal to each other or to be always opposite to each other;

(II) a mode in which the polarity of the wiring current for generating the recording auxiliary magnetic field in the direction of the hard magnetization axis of the storage area is controlled to be alternately changed with the lapse of time independently of the polarity of the wiring current for generating the recording magnetic field in the direction of the easy magnetization axis of the storage area; and (III) modes other than the modes described above.

First, in mode (I), for example, the polarities of a program current for a word line and a bit line current are determined such that the polarity of the program current for the word line is equal to or opposite to the polarity of the bit line current. The example shown in FIG. 6 shows a case where the polarities of both the wiring currents are equal to each other. In order to set the polarities of both the wiring currents to be opposite to each other, the polarities are determined such that, when the word line current flows in the positive direction (or negative direction), the bit line current flows in the negative direction (or positive direction). Since the polarities change depending on the definitions, a word line signal can be synchronized with a bit line signal.

Figure 8:
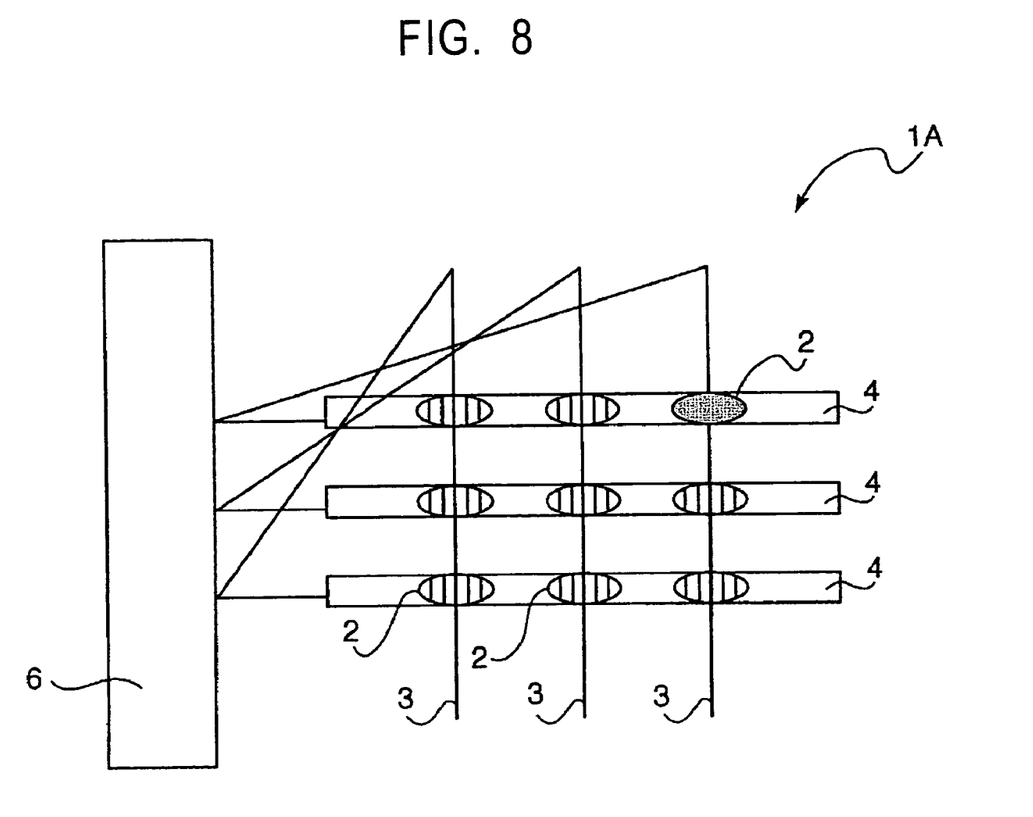
FIG. 8 is a schematic diagram showing another example of the structure of the magnetic memory device according to the present invention.

For example, as shown by an apparatus 1A shown in FIG. 8, a structure in which a driving circuit (peripheral circuit) for driving current flowing to the word line and current flowing to the bit line is shared with both the wiring lines is possible. In other words, since the current for both the wiring lines can use in-phase signals (or opposite-phase signals), for example, in a "3×3" (three rows and three columns) matrix arrangement, as shown in the drawing, by pairing the bit line on the upper side with the word line on the right-hand side, pairing the bit line in the middle with the word line in the middle, and pairing the bit line on the lower side with the word line on the left-hand side, cell selection and writing control can be performed by using the current applied from a driving circuit 6 to the respective lines. A state in which the storage element on the lattice point at the upper right (first row from the top, third column from the left) is selected and writing is performed is shown in the drawing, and current flows to the bit line corresponding to the first row from the top and to the word line on the right-hand side (although the word line current flows to the other elements in the same third column, magnetization reversal does not occur in the second and third rows from the top since the bit line current does not flow to the second and third rows from the top).

In addition to this, a circuit structure for sharing currents is possible by short-circuiting the word line and the bit line. Thus, the flexibility in design is increased.

Also, since a memory that records only one of "1" and "0" does not exist, the bit line current is not inclined in one direction. Thus, the improvement of the resistance to deterioration and the like of wiring, which is an intended object of the present invention, is not interfered with.

Figure 9:
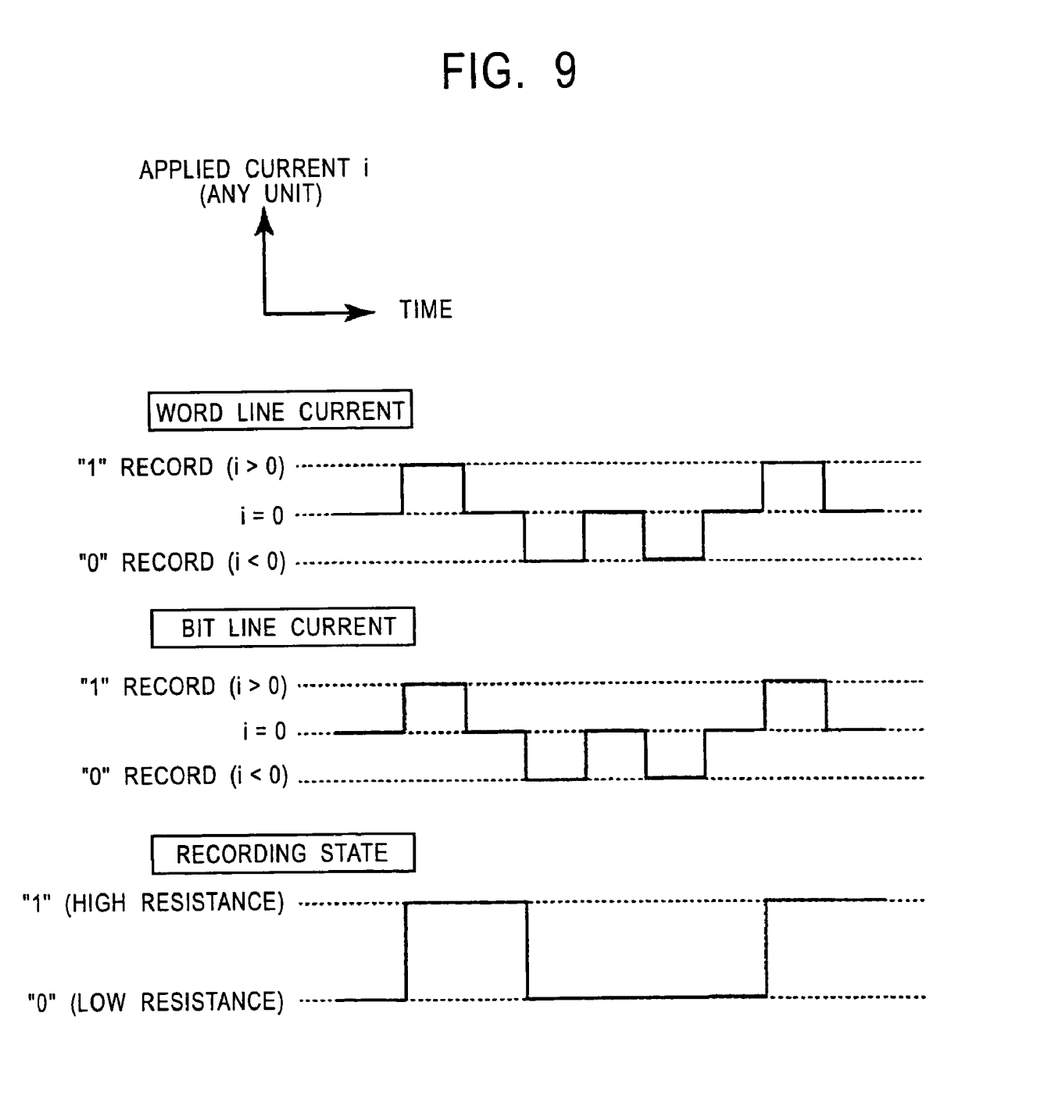
FIG. 9 is an illustration for explaining, together with FIGS. 10 and 11, each mode of the recording control method according to the present invention, and this drawing shows a mode in which the polarities of both wiring currents are equal to each other.

FIG. 9 illustrates a case where a program current flowing to the word line is represented by "1001" for a simple understanding of the feature of mode (I), and the polarities of the directions of the word line current and the bit line current are defined to be equal. Signs and the like are the same as in FIGS. 5 and 6.

As is clear from the drawing, for both the word line current and the bit line current, the frequency of appearance of the positive polarity and the negative polarity is half-and-half (one-to-one). This is an example of the most balanced state (although, actually, there may be some disbalance in accordance with the details of information of the program current, this disbalance is expected to be an almost negligible level when the average over a long period is considered).

In Mode (II), by alternately changing the polarity of the bit line current independently of the polarity of the program current for the word line, a changing current with the best efficiency, in terms of improvement of the reliability of the bit line, is provided.

Figure 10:
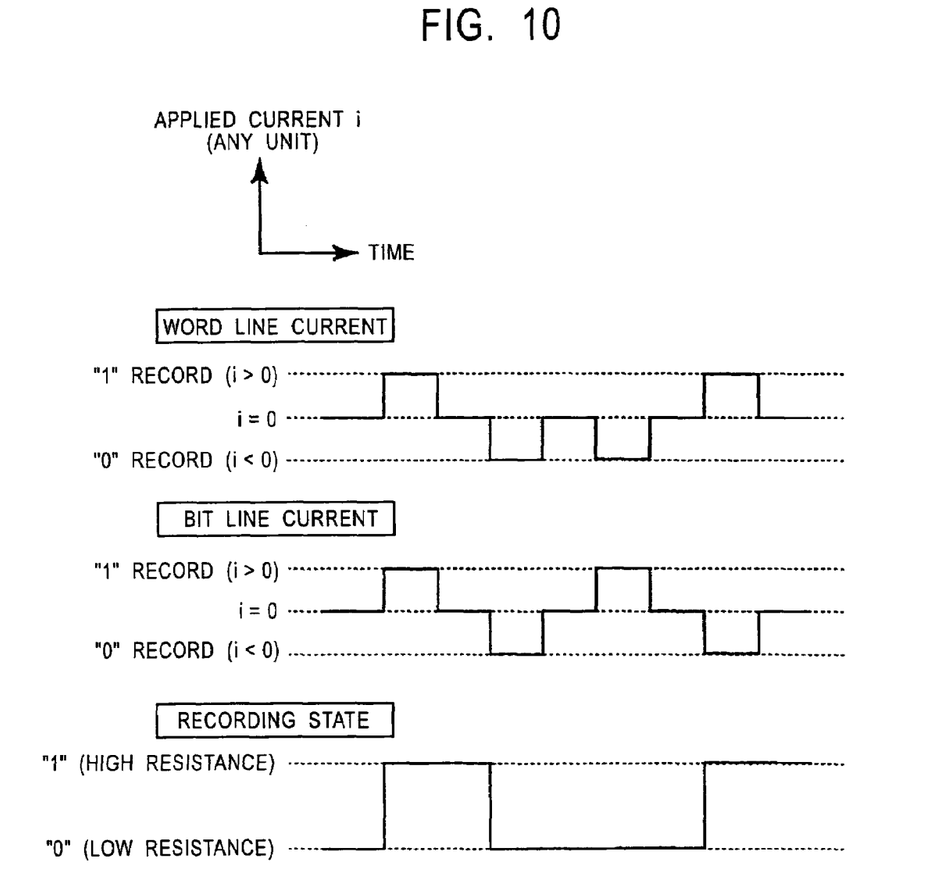
FIG. 10 shows a mode in which the polarity of a bit line current is changed with the lapse of time.

FIG. 10 shows an example of recording control, and signs and the like are the same as in FIGS. 5 and 6.

Although a case where the program current to the word line is represented by "1001" is illustrated, as in the case shown in FIG. 9, the polarity of the bit line current alternately reverses with the lapse of time independently of the polarity of the program current. In other words, since the polarity of the bit line current reverses every time, the frequencies of appearance of both the polarities are precisely divided into half and half.

Figure 11:
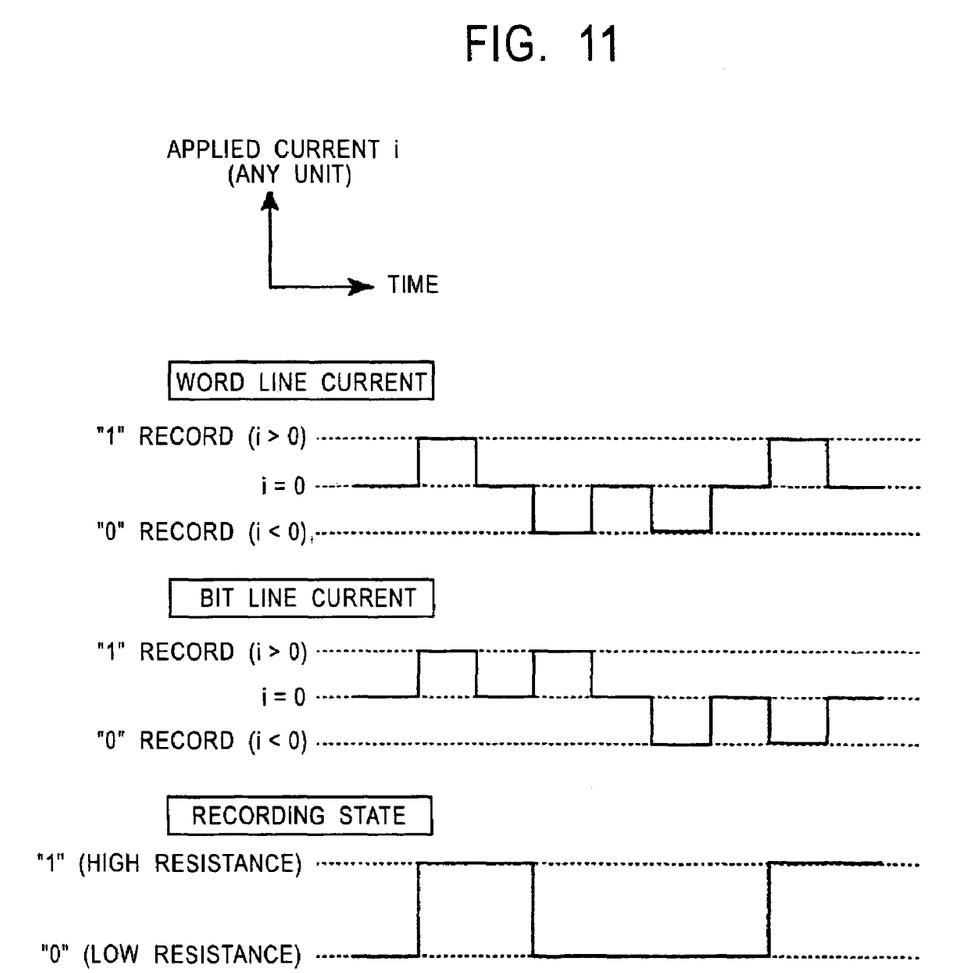
FIG. 11 shows a mode in which the polarity of the bit line current is changed in a random fashion.

Mode (III) includes a mode in which the polarity of the bit line current is changed in accordance with a particular rule and a mode in which the polarity of the bit line current is changed irregularly. For example, in the former example, after allowing a particular polarity to appear a predetermined number of times, the polarity is reversed, and the number of appearance of the reversed polarity is counted to repeat in the same way. Also, in the latter example, changing the polarity of the bit line current in a random fashion independently of the polarity of a program current for the word line (a procedure for modulation using a pseudorandom number and the like) is included. FIG. 11 shows an example of recording control (signs and the like are the same as in FIGS. 5 and 6), and although only a part of the word line current and the bit line current (each of the positive polarity and negative polarity appears two times for each current) is illustrated, irregularity is found by observation over a long period of time. In this case, it is ideally desirable that, for the bit line current, the frequency of appearance of the positive polarity be equal to the frequency of appearance of the negative polarity.

Figure 12:
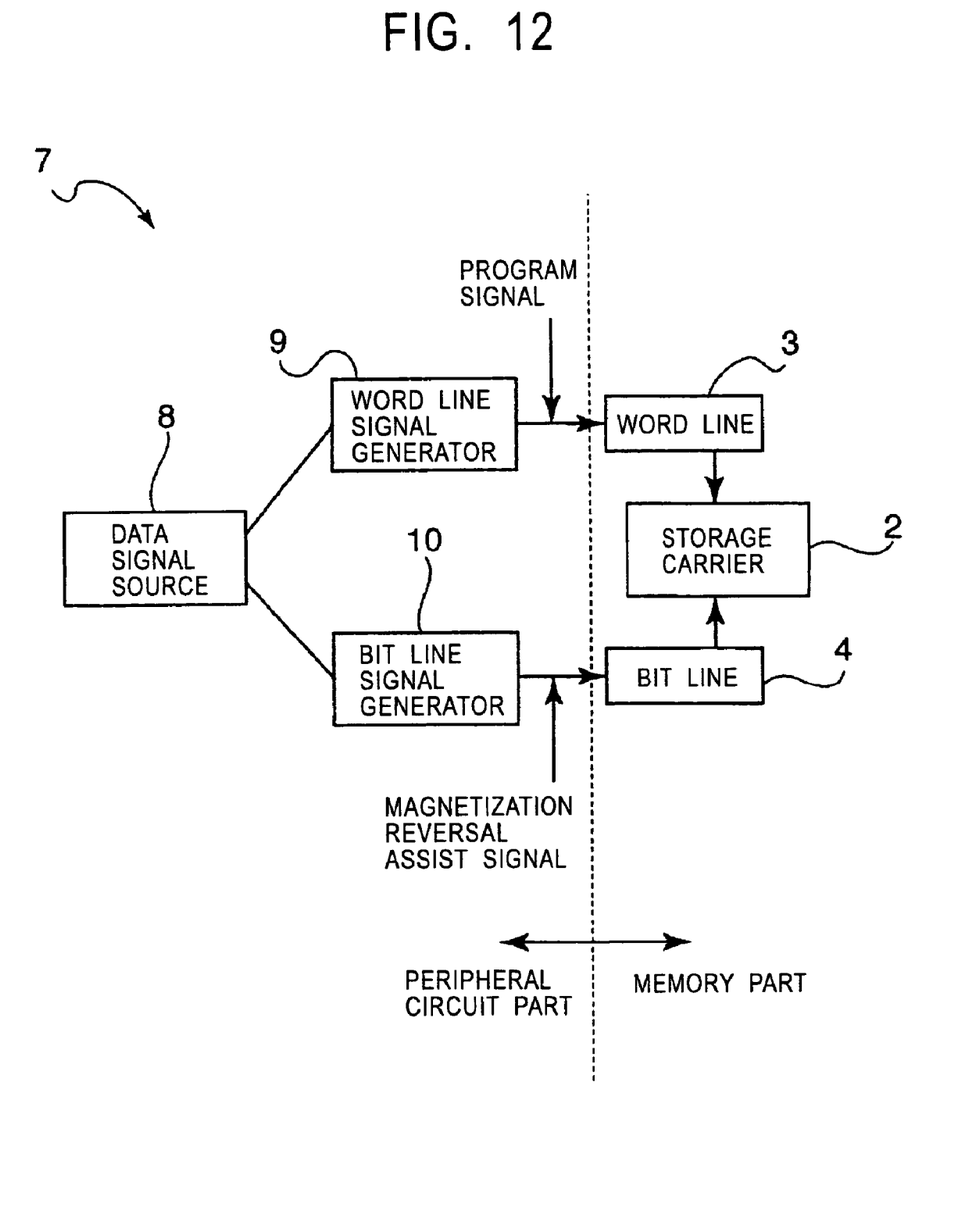
FIG. 12 is a block diagram for explaining an example of the structure of a control circuit according to the present invention.

FIG. 12 schematically shows the structure of a control circuit according to the present invention.

A control circuit 7 controls a program current flowing to a recording word line and includes control means for controlling current flowing to a bit line and the direction of the current.

A word line signal generator 9 generates a program signal in accordance with a signal sent from a data signal source 8 and sends the program signal to each of the word lines 3. The program current is controlled by the program signal and a recording magnetic field is generated for each of the storage carriers (storage elements 2).

Also, a bit line signal generator 10 generates a magnetization reversal assist signal in accordance with a signal sent from the data signal source 8 and sends the magnetization reversal assist signal to each of the bit lines 4. The bit line current is controlled by the magnetization reversal assist signal, and a recording auxiliary magnetic field is generated in the direction of the hard magnetization axis of a storage area of each of the storage carriers (storage elements 2). Then, as described above, the direction of the bit line current is controlled not to be fixed in one direction but to flow bidirectionally.

A part including the word lines, the bit lines, and the storage elements shown on the right-hand side of FIG. 12 constitutes a magnetic memory part, and the other parts shown on the left-hand side constitute the peripheral circuit part described above.

In the explanation for the modes described above, by controlling wiring current for generating a magnetic field in the direction of the hard magnetization axis of a storage area to flow bidirectionally (in other words, current is controlled not to always flow in one direction but current is controlled to be a bidirectional current so as to flow in different directions with the lapse of time) under the assumption that the bit lines are substantially parallel to the direction of the easy magnetization axis, resistance to deterioration, breaking, and the like of recording wiring is improved and the reliability can thus be increased. In contrast, in a case where the recording word lines are substantially parallel to the direction of the easy magnetization axis, since a magnetic field generated by each of the word lines is a magnetic field aligned along the direction of the hard magnetization axis, it contributes to improvement of the reliability of the recording word lines. Since it is known that, for example, aluminum Al is inferior to copper Cu and an Al—Cu alloy in terms of the relationship between wiring material and resistance to electromigration, in a case where a material used for the word lines is Al and a material used for the bit lines is Cu (or an Al—Cu alloy), adopting an arrangement in which the word lines are substantially parallel to the direction of the easy magnetization axis is more effective.

As is clear from the above description, according to the present invention, by controlling, with respect to wiring for generating a magnetic field in the direction of the hard magnetization axis of a storage area of each element, current to flow bidirectionally, in other words, so as not to be fixed in one direction, resistance to deterioration and breaking of wiring is improved and the reliability can thus be increased. Also, the level of density can be increased without significantly changing the material, structure, and the like.

Also, according to the present invention, the flexibility in design of a peripheral circuit for storage elements including a driving circuit for each wiring current can be increased, and the use of signals of a synchronization relationship enables sharing of the same circuit, simplification of the structure, and the like.

Furthermore, the present invention provides efficiency since the polarity (that is, sign) of wiring current for generating a recording auxiliary magnetic field is changed such that both polarities appear equally.

The invention claimed is:

1. A magnetic memory device comprising:
   magnetoresistance-effect storage elements arranged so as to store information by using a change in a magnetization direction of a storage area of each of the storage elements; and
   control means for controlling a polarity of a first wiring current for generating a recording auxiliary magnetic field in a direction of a hard magnetization axis of the storage area, and a polarity of a second wiring current for generating a recording magnetic field in a direction of an easy magnetization axis of the storage area, wherein each of the first and second wiring currents has a first polarity when generating a "1" and a second polarity, different from the first polarity, when generating a "0".

2. The magnetic memory device according to claim 1, wherein a relationship between the polarity of the first wiring current, and the polarity of the second wiring current is controlled to be always equal to each other or to be always opposite to each other.

3. The magnetic memory device according to claim 1, wherein the polarity of the first wiring current is controlled to be changed alternately with a lapse of time independently of the polarity of the second wiring current.

4. A recording control method for a magnetic memory device arranged so as to store information by using a change in a magnetization direction of a storage area of each of magnetoresistance-effect storage elements, comprising:
   generating a first wiring current for generating a recording auxiliary magnetic field in a direction of a hard magnetization axis of the storage area;
   generating a second wiring current for generating a recording magnetic field in a direction of an easy magnetization axis of the storage area;
   polarizing each of the first and second wiring currents with a first polarity to generate a "1"; and
   polarizing each of the first and second wiring currents with a second polarity, different from the first polarity, to generate a "0".

5. The recording control method for a magnetic memory device according to claim 4, wherein a relationship between the polarity of the first wiring current, and the polarity of the second wiring current is controlled to be always equal to each other or to be always opposite to each other.

6. The recording control method for a magnetic memory device according to claim 4, wherein the polarity of the first wiring current is controlled to be changed alternately with a lapse of time independently of the polarity of the second wiring current.

7. A magnetic memory device comprising:

magnetoresistance-effect storage elements arranged so as to store information by using a change in a magnetization direction of a storage area of each of the storage elements; and a control unit configured to control a polarity of a first wiring current for generating a recording auxiliary magnetic field in a direction of a hard magnetization axis of the storage area, and a polarity of a second wiring current for generating a recording magnetic field in a direction of an easy magnetization axis of the storage area, wherein each of the first and second wiring currents has a first polarity when generating a "1" and a second polarity, different from the first polarity, when generating a "0".

8. The magnetic memory device according to claim 7, wherein a relationship between the polarity of the first wiring current, and the polarity of the second wiring current is controlled to be always equal to each other or to be always opposite to each other.

9. The magnetic memory device according to claim 7, wherein the polarity of the first wiring current is controlled to be changed alternately with a lapse of time independently of the polarity of the second wiring current.

* * * * *